United States Patent [19]

Coldren et al.

[11] 4,354,898
[45] Oct. 19, 1982

[54] METHOD OF PREFERENTIALLY ETCHING OPTICALLY FLAT MIRROR FACETS IN INGAASP/INP HETEROSTRUCTURES

[75] Inventors: Larry A. Coldren, Holmdel; Kazuhito Furuya, Hazlet, both of N.J.

[73] Assignee: Bell Telephone Laboratories, Incorporated, Murray Hill, N.J.

[21] Appl. No.: 276,942

[22] Filed: Jun. 24, 1981

[51] Int. Cl.³ .......................................... H01L 21/308
[52] U.S. Cl. .................................. 156/647; 156/649; 156/652; 156/655; 156/662
[58] Field of Search .............. 156/643, 647, 649, 655, 156/662, 652; 357/60

[56] References Cited

U.S. PATENT DOCUMENTS

| | | | |
|---|---|---|---|
| 3,833,435 | 9/1974 | Logan et al. | 156/11 |
| 4,007,104 | 2/1977 | Summers | 156/649 |
| 4,029,531 | 6/1977 | Marinelli | 156/647 |
| 4,285,763 | 8/1981 | Coldren | 156/643 |

OTHER PUBLICATIONS

Furuya et al., "Crystallographic... Optics" Electronics Letter, vol. 17, No. 17 (8/20/81) pp. 582–583.
Burton et al. "Plasma... Diodes" Appl. Phs. Lett., vol. 37, No. 4 (8/80) p. 411.
Faust "Etching... Compounds" *Compound Semiconductors*, vol. 1, Preparation of III-V Compounds, Reinhold Publ. (1963) pp. 445–468.
Tijburg et al. "Selective... Systems" J. Electro. Chem. Soc., vol. 123, No. 5 (5/76) pp. 687–691.
C. Hurwitz et al., "Integrated GaAs-AlGaAs Double-Heterostucture Lasers," *Applied Physics Letters*, vol. 27, No. 4, p. 241 (8/75).
S. Arai et al., "New 1.6 $\mu$m Wavelength GaInAsP/InP Burial Heterostructure Lasers," Electronics Letters, vol. 16, p. 349 (5/80).
P. Wright et al., "InGaAsP Double Heterostructure Lasers ($\lambda = 1.3$ $\mu$m) with Etched Reflectors," Applied Physics Letters, vol. 36, No. 7, p. 518 (4/80).
K. Iga et al., "GaInAsP/InP DH Lasers with a Chemically Etched Facet," IEEE J. of Quantum Electronics, vol. QE-16, No. 10, p. 1044 (10/80).

*Primary Examiner*—Jerome W. Massie
*Attorney, Agent, or Firm*—Gregory C. Ranieri

[57] ABSTRACT

Highly reproducible, optically flat mirror facets are created by contacting a predetermined area of the InGaAsP/InP heterostructure system with a chemical etchant for a time period sufficient to expose a substantially vertical crystallographic surface throughout the entire heterostructure system. Contact of the exposed surface with HCl causes a preferred crystallographic plane to be exposed as an optically flat mirror facet.

17 Claims, 15 Drawing Figures

METHOD OF PREFERENTIALLY ETCHING OPTICALLY FLAT MIRROR FACETS IN INGAASP/INP HETEROSTRUCTURES

TECHNICAL FIELD

This invention relates to a method of chemical etching a semiconductor body and, in particular, a method of chemically etching an optically flat facet on a preferred crystallographic plane in a multilayer InGaAsP/InP system.

BACKGROUND OF THE INVENTION

In general, an optoelectronic device such as a laser is fabricated along a preferred crystallographic direction. Mirror facets for such a device are formed on a plane perpendicular to the preferred direction and sidewalls of the device are formed on planes parallel to that direction. Also, it is desirable for at least the mirror facets to exhibit the characteristic of optical flatness.

Optically flat mirror facets are created by manual cleaving or by etching. Though manual cleaving does produce high quality mirror facets, this technique yields a small number of useable cleaved facets in relation to the number of crystals actually cleaved.

Etching methods encompass both wet and dry chemical etching. Wet chemical etching techniques generally comprise several distinct phases each of which employs a particular chemical compound for etching a selected material of the multilayer structure such as an InP layer in an InGaAsP/InP system. These chemical etching techniques are generally isotropic and, therefore, are only capable of creating an extremely narrow region of optical flatness in a desired layer, for instance, the quaternary layer of the heterostructure system. Examples of wet chemical etching techniques are given in the following references: K. Iga et al., "GaInAsP/InP DH Lasers with a Chemically Etched Facet," *IEEE Journal of Quantum Electronics*, QE-16, p. 1044 (1980), (a solution of HCl: $CH_3COOH$: $H_2O_2$=(1:2:1)); P. D. Wright et al., "InGaAsP Double Heterostructure Lasers ($\lambda$=1.3 $\mu$m) with Etched Reflectors," *Applied Physics Letters*, Vol. 36, p. 518 (1980), (a solution of Br: $CH_3OH$); and S. Arai et al., "New 1.6 $\mu$m Wavelength GaInAsP/InP Buried Heterostructure Lasers," *Electronics Letters*, Vol. 16, p. 349 (1980), (a sequential process of Br: $CH_3OH$ followed by $4HCl$-$H_2O$).

Dry chemical etching techniques include reactive-ion etching, reactive-ion beam etching and plasma etching. For separate descriptions of each of the above, see R. E. Howard et al., "Reactive-Ion Etching of III–V Compounds," *Topical Meeting on Integrated and Guided Wave Optics Digest* (IEEE: New York 1980) WA-2; M. A. Bösch et al., "Reactive-Ion Beam Etching of InP with $Cl_2$," *Applied Physics Letters*, Vol. 38, p. 264 (1980); and R. H. Burton et al., "Plasma Separation of InGaAsP/InP Light-Emitting Diodes," *Applied Physics Letters*, Vol. 37, p. 411 (1980).

Reactive ion etching avoids some of the problems of the wet chemical etching methods and is useful in making grooves in a heterostructure system. This type of etching is effectively a single step process which results in facets which approximately planar but "overcut". That is, the facets which form the groove slope toward each other from the top of the groove to the bottom. Although these facets are reproducible, they lack the optically flat mirror quality necessary for certain applications. Similarly, the other dry etching techniques create facets satisfactory for use as waveguide sidewalls and die separations but lacking the optically flat mirror quality necessary for optoelectronic and integrated optics devices.

SUMMARY OF THE INVENTION

Reproducible, optically flat mirror facets are created on a multilayer semiconductor heterostructure body by processing a predetermined area on a given surface of the semiconductor body to expose a crystallographic surface across all layers of the semiconductor body at a substantially definite slope with respect to the given surface and, then, contacting the exposed crystallographic surface with HCl for a time period sufficient to expose a preferred crystallographic plane as an optically flat mirror facet of the semiconductor heterostructure body.

For a III–V heterostructure system composed of alternating layers of InP (binary layer) and InGaAsP (quaternary layer), the processing step comprises either a single dry or wet chemical etchant application resulting in an exposure of some portion of each layer or a series of selective etchant applications which expose one layer at a time in sequence.

BRIEF DESCRIPTION OF THE DRAWINGS

A more complete understanding of the invention may be obtained by reading the following description of specific illustrative embodiments of the invention in conjunction with the appended drawings in which.

DETAILED DESCRIPTION

Optoelectronic and integrated optics devices are grown in certain desirable crystallographic directions. For III–V semiconductor heterostructure lasers and the like composed of InGaAsP/InP on a (100) substrate, the desirable direction for the laser axis is <01$\bar{1}$>. Hence, it is necessary to create optically flat, mirror quality facets on the (01$\bar{1}$) crystallographic plane, because this plane is perpendicular (vertical) to the <01$\bar{1}$> direction and the (100) plane of the substrate.

Figure 1:
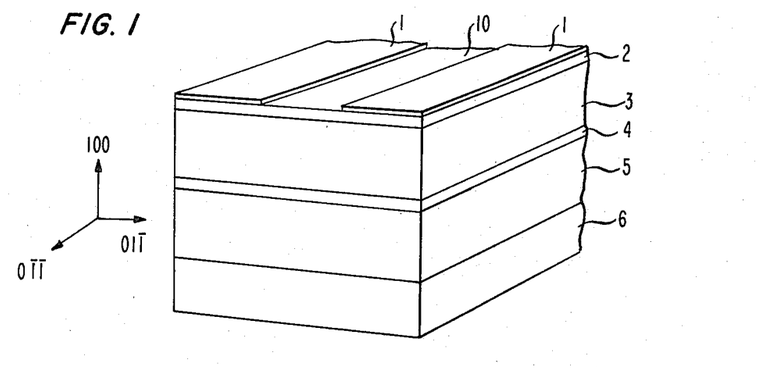
FIG. 1 shows a portion of a multilayer semiconductor heterostructure body having a stripe-mask deposited on the (100) surface with the stripe along the <011> direction.

FIG. 1 shows a multilayer InGaAsP/InP heterostructure body having mask 1 on the (100) crystallographic plane. Also included in FIG. 1, as well as all remaining figures, is a set of basis lattice vectors indicating the three-dimensional orientation of the semiconductor body.

The semiconductor heterostructure of FIG. 1 comprises mask layer 1, p+-type cap layer 2, p-type upper cladding cladding layer 3, n-type or undoped active layer 4, n-type lower cladding layer 5, and n-type substrate 6. The conductivity type for each layer may be reversed so that each p-layer becomes an n-layer and each n-layer becomes a p-layer. For the example described herein, cap layer 2 is approximately 3000–5000 angstroms thick, cladding layers 3 and 5 are approximately 1.5–2 $\mu$m thick, active layer 4 is approximately 1000–3000 angstroms thick, and substrate 6 is approximately 75–100 $\mu$m thick.

Semiconductor materials for the heterostructure are chosen from the group of III–V compounds. In particular, a binary III–V compound, InP, is employed for cladding layers 3 and 5 and for substrate 6. A quaternary III–V compound, $In_{1-y}Ga_yAs_xP_{1-x}$, is utilized for cap layer 2 and active layer 4, wherein the alloy composition ratios x and y are chosen to produce a particular wavelength or energy bandgap and lattice constant for the heterostructure. For a description of techniques for choosing x and y, see R. Moon et al, "Bandgap and Lattice Constant of GaInAsP as a Function of Alloy Composition", *J. Electron. Materials*, Vol. 3, p. 635 (1974). In the description which follows, exemplary composition ratios, x=0.52 and y=0.22, are selected to produce a wavelength of 1.3 $\mu$m (0.95 eV). It is important to note that the inventive method is equally applicable when these ratios are varied to produce wavelengths in the range of 1.1 $\mu$m to 1.7 $\mu$m. For concentration ratios producing wavelengths above 1.5 $\mu$m, it is necessary to grow a quaternary antimeltback layer between layers 3 and 4 during liquid phase epitaxial growth of the heterostructure. The presence of such an antimeltback layer will require the inventive method to be modified only slightly, in terms of etching exposure times, to provide acceptable results.

A mask layer is deposited on the (100) plane of the semiconductor body by any suitable deposition process such as chemical vapor deposition or the like. An exemplary mask layer is chemically composed of silicon-nitride. Mask 1 is formed by photolithography and dry etching of the silicon nitride to have edges which are substantially smooth. Striped regions in mask 1 leave surface areas such as surface 10 completely exposed, as opposed to being covered by mask 1. The stripe in mask 1 is aligned with the <011> direction of the semiconductor heterostructure body. Although this type of stripe mask produces a groove in the semiconductor body, other masks such as the one shown in FIG. 12 can be utilized to produce a single wall, i.e., for effectively slicing away an unmasked portion of the semiconductor body.

Figure 2:
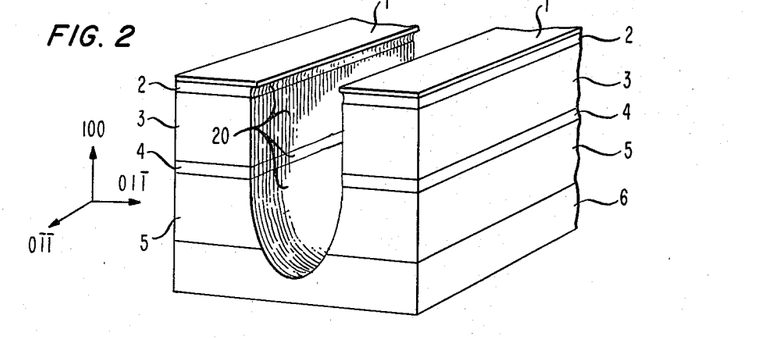
FIGS. 2 and 3 show structural changes of the semiconductor body in FIG. 1 after successive steps in a first exemplary etching method embodying the invention.

FIG. 2 illustrates the structural changes in the semiconductor body of FIG. 1 after processing that body with a chemical etchant. The chemical etchant is either a wet or dry chemical etchant or etching process. Dry chemical etching processes, as described above, include reactive-ion etching, reactive-ion beam etching, and plasma etching. Detailed descriptions of these processes are found in the technical references cited above. In particular, information pertaining to the reactive-ion etching process of III–V semiconductor compounds disclosed in U.S. Pat. No. 4,285,763 issued to L. A. Coldren on Aug. 25, 1981, is expressly incorporated herein by reference.

A wet chemical etchant suitable for creating the structural change shown in FIG. 2 in a single step is $HCl:HNO_3=(1:\alpha)$, where $1 \leq \alpha \leq 5$ and, preferably, $\alpha$ is equal to 3. This proportion of HCl and $HNO_3$ is critical to ensuring that no step discontinuities appear at the interface of the heterojunction and surface 20 exposed by the $HCl:HNO_3$ etchant. By experimentation, it has been found that, for less $HNO_3$ than an amount dictated by an optimum proportion, quaternary layer 4 is etched more slowly than binary layer 3. This gives surface 20 the appearance of being stepped outward toward the etched groove such that layers 4 and 5 protrude into the groove beyond the exposed edge of layer 3. If the amount of $HNO_3$ exceeds the optimum proportion, the opposite result appears because quaternary layer 4 etches more quickly than layer 3. So, surface 20 appears to be stepped inward from the etched groove and layer 3 protrudes into the groove beyond the exposed edges of layers 4 and 5. Optimization of the value of $\alpha$ permits the etchant to react with both the binary layers (layers 3, 5, and 6) and quaternary layers (layers 2 and 4) at approximately the same rate. Hence, surface 20, which is exposed by this optimized etchant, is substantially planar through at least layers 2, 3, and 4.

In practice, optimization is performed by using a small sample of the semiconductor body to be etched. The sample is then subjected to the etchant while the value of $\alpha$ is adjusted until the optimum value is found. Certain factors influence the selection of a value for $\alpha$ such as the alloy composition ratios x and y, the thickness of each semiconductor layer in the heterostructure, the age and strength or diluteness of the etchant component chemicals, and the temperature of the etchant.

Assuming that the value of $\alpha$ is optimized for the wet chemical etchant, $HCl:\alpha HNO_3$, it is possible to contact the chemical etchant with surface 10 for a sufficient time period to expose an edge of each heterostructure layer to form crystallographic surface 20 at a definite slope in relation to the crystallographic plane, i.e., the (100) plane, which originally contained surface 10. For certain crystallographic orientations, such as the particular one shown in FIG. 2, exposed crystallographic surface 20 is substantially perpendicular to the (100) plane.

In one example from experimental practice, the semiconductor heterostructure body defined above is immersed and agitated in a chemical bath of $HCl:3HNO_3$ for approximately 30 seconds at 22 degrees Centigrade. After this immersion, the etching process is halted by rinsing the $HCl:3HNO_3$ from the semiconductor body with deionized water and surface 20 is exposed. However, surface 20 has a roughened appearance exhibiting irregular characteristics such as high spots and striations generally along the <100> direction. A controlled amount of undercutting occurs causing surface 20 to intersect mask 1 from underneath rather than intersecting the edge of mask 1. These irregularities except undercutting also appear after exposure of surface 10 to the dry chemical etching processes. Regardless of the initial processing step employed, i.e., wet or dry chemical etching, a polishing step is necessary to remove these irregularities from exposed crystallographic surface 20.

Figure 3:
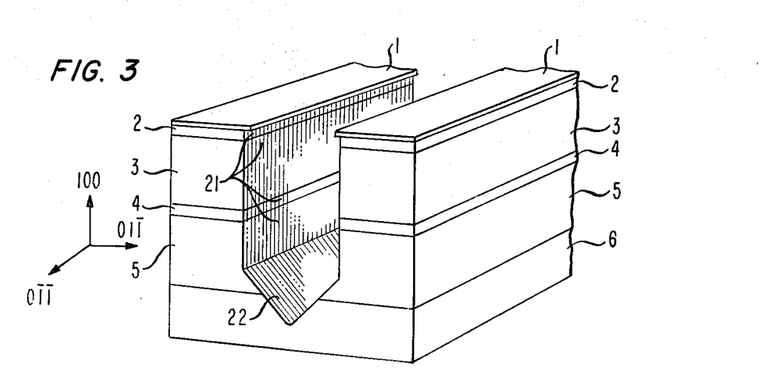

FIG. 3 illustrates the structural changes which appear after the semiconductor body of FIG. 2 is polished with a chemical etchant. In this instance, polishing entails contacting exposed surface 20 (FIG. 2) with HCl for a time sufficient to expose a preferred crystallographic plane of the semiconductor body. HCl is both material selective and orientationally preferential as an etchant. As before, the semiconductor body of FIG. 2 is immersed in a bath of HCl and agitated. The polishing process is halted by rinsing the etched semiconductor body in deionized water. In one example, concentrated HCl is utilized in the bath at 22 degrees Centigrade with an immersion or etching time of approximately 3 seconds. For more dilute concentrations of HCl, the etching time must be adjusted and increased accordingly.

For the example shown in FIG. 3, the crystallographic plane preferentially exposed by the HCl etchant is $(01\bar{1})$ plane, denoted as surface 21, which is perpendicular to the (100) plane. Surface 21 is an optically flat mirror facet because HCl preferentially exposes the $(01\bar{1})$ crystallographic plane of only the InP layers, i.e., layers 3 and 5, and does not etch the quaternary layers, layers 2 and 4. However, the etching process is controlled to make layers 2 through 5 substantially coplanar. It is of interest to note that, at the lower portion of a trough or groove in layers 5 and 6 created by the etching process, crystallographic plane $(11\bar{1})$ denoted as surface 22 is also exposed as a polished facet. Surface 22 is generically referred to as a (111)B crystallographic plane which includes planes $(11\bar{1})$, $(1\bar{1}1)$, $(\bar{1}11)$, and $(\bar{1}\bar{1}\bar{1})$. The suffix 'B' means that the particular plane includes only phosphorus atoms which are chemically reactive and, therefore, capable of being removed by a chemical etchant. Similarly, a (111)A crystallographic plane, which will be discussed below, includes planes $(1\bar{1}\bar{1})$, $(\bar{1}1\bar{1})$, $(\bar{1}\bar{1}1)$, and (111). The suffix 'A' means that the particular plane includes only indium atoms which appear to be substantially inert and resist removal by chemical etching.

To recapitulate, the etching method shown in FIGS. 1 through 3 includes the steps of:

(1) processing of unmasked surface 10 and the area thereunder of the multilayer semiconductor heterostructure body via reactive-ion etching, reactive-ion beam etching, plasma etching, or etching with HCl:HNO$_3$=(1:$\alpha$) for $1\leq\alpha\leq 5$ for a time period sufficient to expose crystallographic surface 20 at a substantially definite slope to unmasked surface 10, and (2) contacting crystallographic surface 20 with HCl for a time period sufficient to expose a preferred crystallographic plane, surface 21, as a polished and optically flat mirror facet of the semiconductor heterostructure.

FIGS. 4, 5, 6, and 7 show structural changes which appear after the semiconductor heterostructure body of FIG. 1 is subjected to the etchants in a sequential etching process. The method shown in FIGS. 4 through 7 is called sequential etching because each layer of the multilayer structure directly under exposed surface 10 (FIG. 1) is etched away in sequence. That is, the portion of cap layer 2 directly under surface 10 is etched away with a wet or dry chemical etchant to expose surface 12 on cladding layer 3. Since the etching process stops at a heterojunction, it is apparent that at least the wet chemical etchant must exhibit the property of material selectivity.

Several wet chemical etchants have been shown to be effective for selectively etching quaternary layers such as layers 2 and 4. Examples of several selective etchants include: a solution of $H_2SO_4:H_2O_2:H_2O=(10:1:1)$ as described in R. J. Nelson et al., "High-Output Power in InGaAsP/InP ($\lambda=1.3$ $\mu$m) Strip-Buried Heterostructure Lasers," *Applied Physics Letters*, Vol. 36, p. 358 (1980); or AB etchant, wherein the A solution is (40.0 ml. H$_2$O+0.3 g.Ag NO$_3$+40.0 ml. HF) and the B solution is (40.0 g. CrO$_3$+40.0 ml. H$_2$O) and A:B=(1:1) as described in G. H. Olsen et al., "Universal Stain/Etchant for Interfaces in III-V Compounds," *Journal of Applied Physics*, Vol. 45, No. 11, p. 5112 (1974); or a solution of KOH:K$_3$Fe(CN)$_6$:H$_2$O. Etching time for the quaternary layers varies according to thickness of the quaternary layer, temperature, and alloy composition ratios, x and y, for the quaternary layers. For a 3000 angstroms thickness of layer 2 ($\lambda=1.3$ $\mu$m) and a temperature of 22 degrees Centigrade, the following approximate etching times produce the results shown in FIGS. 4 and 6: AB etchant for approximately 15 seconds, and KOH:K$_3$Fe(CN)$_6$:H$_2$O etch for approximately 8 seconds. This etching step is halted by rinsing the etched semiconductor body in deionized water.

Figure 4:
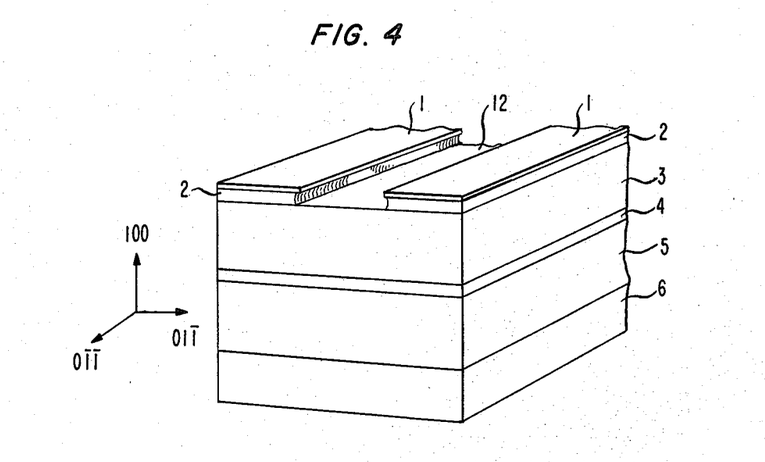
FIGS. 4, 5, 6 and 7 show structural changes of the semiconductor body in FIG. 1 after each of four sequential steps in a second exemplary etching method embodying the invention.
Figure 5:
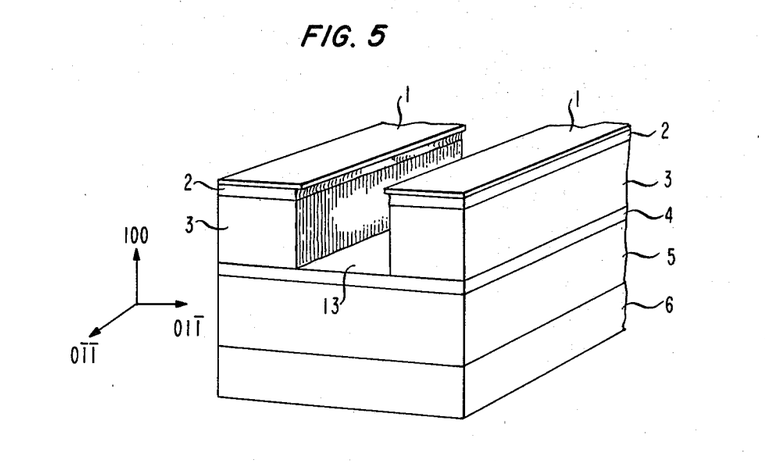

FIG. 5 shows the structural change of the semiconductor body in FIG. 4 after etching in an InP selective etch. For this etching step, HCl is a suitable etchant to cut away the portion of layer 3 under surface 12 (FIG. 4), thereby exposing surface 13 on quaternary layer 4. This etchant stops reacting automatically at surface 13, however, it must be carefully controlled to avoid causing a severe undercut in the remaining portions of layer 3 under mask 1. For an InP layer thickness of approximately 1.5 $\mu$m, an exemplary etching time period for concentrated HCl is approximately 45 seconds to produce the results shown both in FIG. 5 and FIG. 7. After this etching step as shown in FIG. 5, it is important to note that the etched, exposed walls of layer 3 exhibit crystallographic smoothness.

Figure 6:
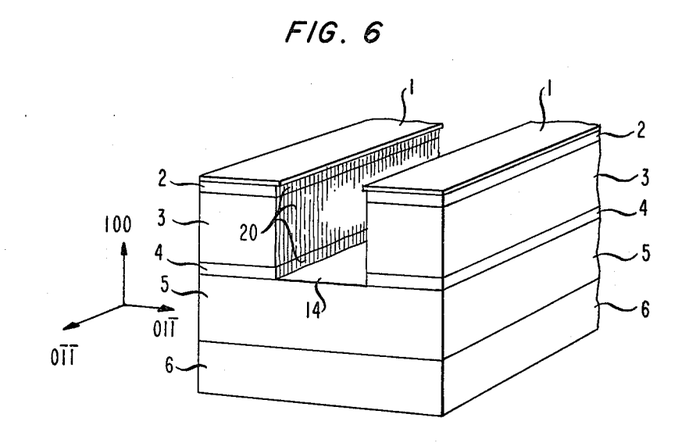

FIG. 6 illustrates the structural change apparent in the semiconductor heterostructure body, after the body shown in FIG. 5 is contacted with a wet or dry chemical etchant to selectively etch quaternary layer 4 directly under surface 13 for a time period sufficient to expose surface 14 on layer 4. Also, crystallographic surface 20 is exposed at a definite slope to the surface containing mask 1 and surface 10 (FIG. 1). The etching procedure and the etchants employed at this step have been described above in relation to FIG. 4.

Figure 7:
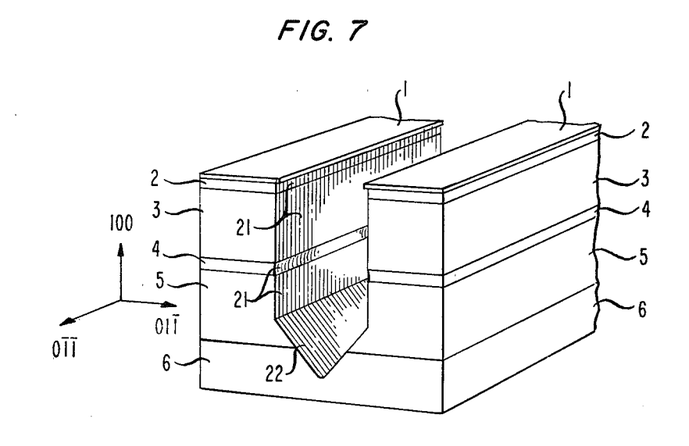

FIG. 7 shows the completion of all structural changes caused by the sequential etching process. Again, an InP selective etchant, HCl, is contacted with exposed surfaces of the semiconductor body create an optically flat mirror facet at surface 21. In particular, surface 14 and crystallographic surface 20 are brought into contact, via immersion and agitation as described above, with a solution of HCl for a time period sufficient to expose a preferred crystallographic plane as the optically flat mirror facet. For this example, the etching time period in a bath of concentrated HCl required to produce exposure of the $(01\bar{1})$ crystallographic plane at surface 21 is approximately 20 seconds. As stated above, surface 22 is also exposed through the InP material comprising layer 5 and substrate 6. Surface 22 is a (111)B crystallographic plane.

FIGS. 8, 9, 10, and 11 show another sequential process for etching the semiconductor heterostructure of FIG. 1. One attribute of this process is that it causes less undercutting than the previous processes.

Figure 8:
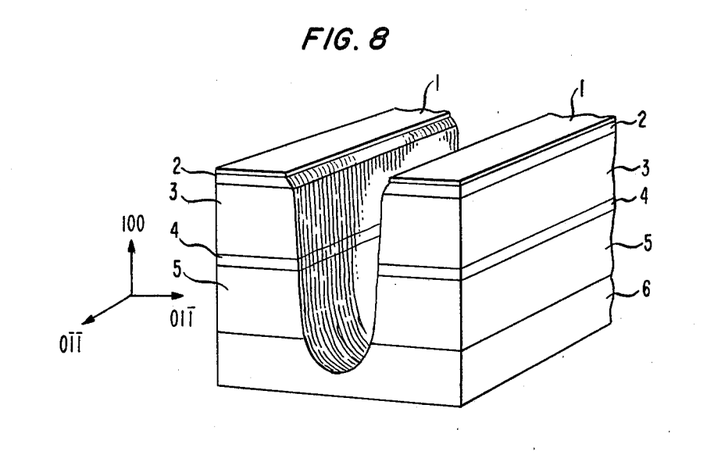
FIGS. 8, 9, 10 and 11 illustrate structural changes of the semiconductor body in FIG. 1 after each of four sequential steps in a third exemplary etching method embodying the invention.

In FIG. 8, the semiconductor body is shown to have a groove directly under surface 10 (FIG. 1), i.e., the unmasked stripe region between adjacent sections of mask 1. This groove is created by either the wet or dry chemical etchants described in relation to FIG. 2 with one difference being that sidewalls of groove are not substantially perpendicular (vertical) to crystallographic plane (100) containing mask 1.

Figure 9:
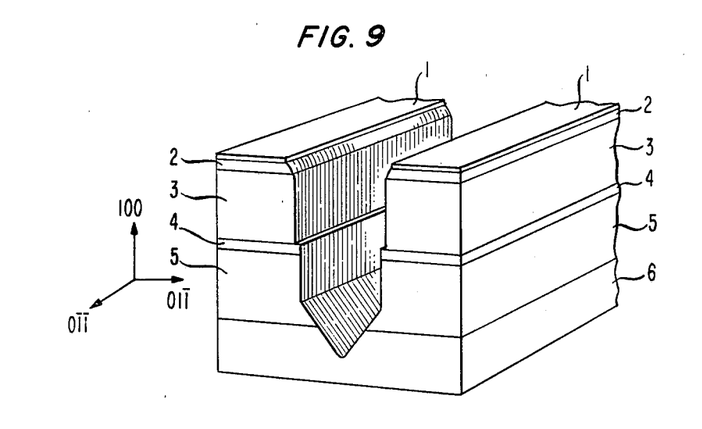

FIG. 9 illustrates the structural changes to layers 3 and 5 and to substrate 6 after the semiconductor body of FIG. 8 is immersed in an InP selective polishing etchant such as HCl. The etched surfaces of layers 3 and 5 and substrate 6 are depicted as being crystallographically smooth. Immersion and agitation in this step are required for only a short time period, for example, 3 seconds. This immersion is followed by a rinse in deionized water to halt the etching process.

The results shown in FIG. 9 are exaggerated for clarity of presentation. Layers 4 and 5 protrude only slightly into the groove because of the inclination of the sidewalls of the groove. If it is necessary to remove this slight protrusion, the remaining steps shown in FIGS. 10 and 11 are available to create a perfectly flat surface.

Figure 10:
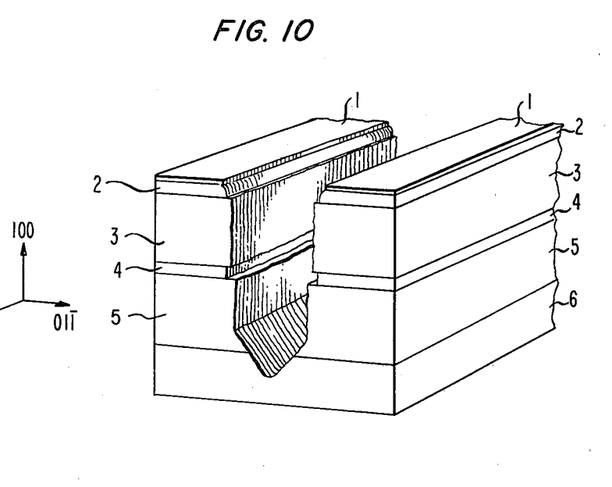

FIG. 10 shows structural changes to quaternary layers 2 and 4 after processing the semiconductor body of FIG. 9 with a quaternary material selective etch such as the wet or dry chemical etchants described above in relation to FIG. 4. For the wet chemical etchants described above, the etching times to complete this step at room temperature are shorter, by a factor of approximately one-quarter to one-third, than the etching times given in relation to the step shown in FIG. 4. It is critical to this step that the etching be controlled to align the exposed surfaces of layers 2 and 4 on substantially the same plane.

Figure 11:
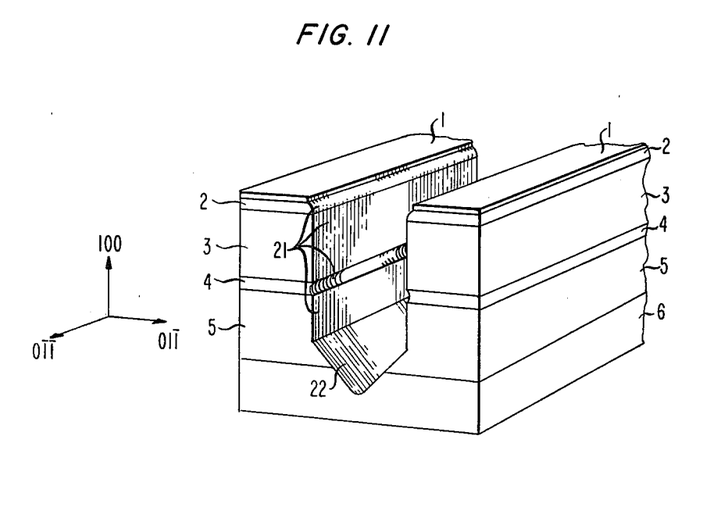

A final polishing step for the semiconductor body of FIG. 10 is shown in FIG. 11. After this step, crystallographic plane (01$\bar{1}$) is preferentially exposed by HCl at surface 21. Surface 21 is an optically flat mirror facet because of the alignment of layers 3, 4, and 5. For concentrated HCl, this polishing etch step is necessary for only a short time period such as 3 seconds.

Figure 12:
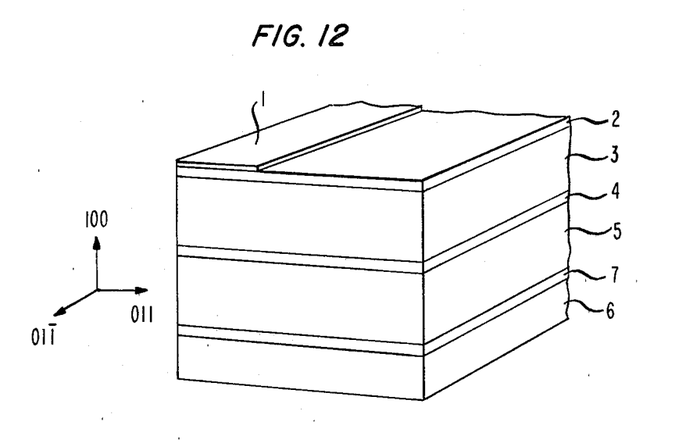
FIG. 12 shows a portion of a multilayer semiconductor heterostructure body having a stripe-mask deposited on the (100) surface with the stripe along the <01$\bar{1}$> direction.

The semiconductor body shown in FIG. 12 is at an orientation displaced 90 degrees from that shown in FIG. 1. Mirror facets are created on crystallographic plane (011) in this orientation and are useful in producing ring lasers and sidewalls parallel to the laser axis for heterostructure lasers. The (100) surface of layer 2 has mask 1 partially disposed thereon with stripes in the (011) direction. Layer 7 is quaternary layer similar in composition and thickness to layers 2 and 4.

Figure 13:
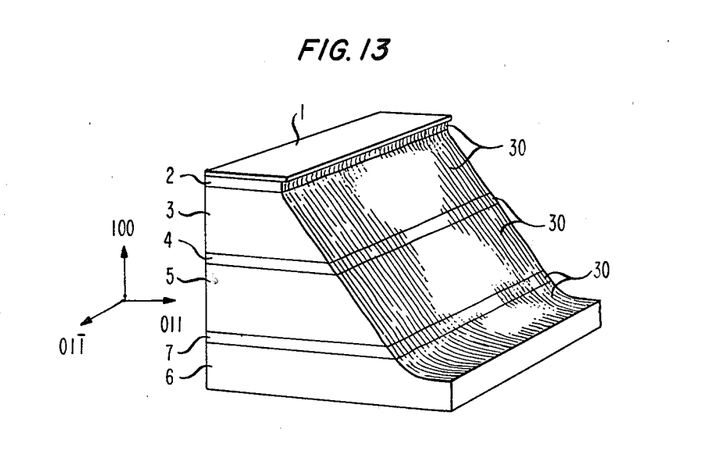
FIGS. 13, 14 and 15 show structural changes of the semiconductor body of FIG. 12 after each of three successive steps in a fourth exemplary etching method embodying the invention.

After the semiconductor body of FIG. 12 has reacted with a chemical etchant such as a Br:$CH_3OH$ solution (1%, for 30 seconds) or $HCl:HNO_3=(1:\alpha)$ (as described earlier), for 30 seconds, crystallographic surface 30 appears as shown in FIG. 13. Surface 30 is an oblique surface cutting through each layer of the semiconductor heterostructure near a (111)A crystallographic plane which is inert as mentioned above in relation to FIG. 3.

Figure 14:
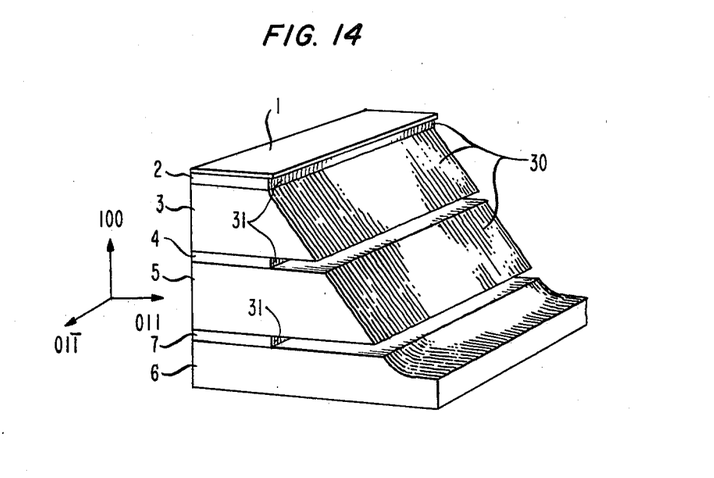

FIG. 14 shows the structural changes which result in quaternary layers 4 and 7 after the semiconductor heterostructure of FIG. 13 is contacted by a selective quaternary etchant such as one described above in relation to FIG. 4. It is important that the thickness and composition for layers 4 and 7 be chosen appropriately so that the selective quaternary etchant causes each portion of surface 31 to be substantially coplanar with each other portion of surface 31 simultaneously. For the exemplary semiconductor body and layer thicknesses described above, etching time periods approximately seven or eight times longer than those defined for the quaternary layer selective wet chemical etchants described in relation to FIG. 4 above.

Figure 15:
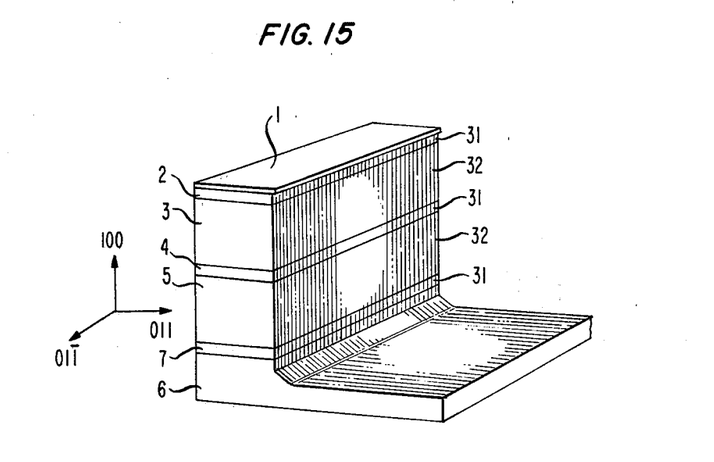

The results of a final polish etching step on the semiconductor heterostructure body of FIG. 14 are shown in FIG. 15. The polish etchant is HCl which is material selective (InP) and orientationally preferential (crystallographic plane (011)). Because of the hollow cavities left by the removal of quaternary layers 4 and 7, the HCl is able to etch layers 3 and 5 from underneath through the (111)B plane and exposing, thereby, crystallographic plane (011) at surface 32 on layers 3 and 5. By proper experimentation with layer thickness and composition and etching times, it is possible to have surfaces 31 and 32 of layers 3 and 5, and 2, 4, and 7, respectively, coplanar in crystallographic plane (011) as an optically flat mirror facet. For concentrated HCl, the etching time period is determined to be approximately 20 seconds.

What is claimed is:

1. A method for etching a multilayer semiconductor heterostructure body having alternating layers of InGaAsP and InP on a substrate layer, the method comprising the steps of:

contacting a predetermined area on a given surface of the semiconductor body with a chemical etchant solution of $HCl:HNO_3=(1:\alpha)$ for a time period sufficient to expose a crystallographic surface through the alternating layers of the semiconductor body substantially perpendicular to the given surface, $\alpha$ is in the range $1<\alpha\leq5$, and contacting the exposed crystallographic surface with HCl for a time period sufficient to expose a preferred crystallographic plane as an optically flat mirror facet of the semiconductor heterostructure body.

2. A method for etching a multilayer semiconductor heterostructure body having alternating layers of InGaAsP and InP on a substrate layer, the method comprising the steps of:

processing a predetermined area on a given surface of the semiconductor body with a material selective chemical etchant for a time period sufficient to expose a portion of a crystallographic surface corresponding to an InGaAsP layer and an abutting InP layer, contacting the exposed crystallographic surface with HCl for a time period sufficient to expose a preferred crystallographic plane corresponding to an exposed InP layer abutting the InGaAsP layer, as an optically flat mirror facet of the semiconductor heterostructure body, the preferred plane being substantially coplanar with the exposed portion of the InGaAsP crystallographic surface, and iterating in sequence the processing step followed by the contacting step.

3. The method as defined in claim 2 wherein the chemical etchant is AB etchant.

4. The method as defined in claim 2 wherein the chemical etchant is $H_2SO_4:H_2O_2:H_2O=(10:1:1)$.

5. The method as defined in claim 2 wherein the chemical etchant is a solution of $KOH:K_3Fe(CN)_6:H_2O$.

6. A method for etching a multilayer semiconductor heterostructure body having alternating layers of InGaAsP and InP on a substrate layer, the method comprising the steps of:

processing a predetermined area on a given surface of the semiconductor body with a first chemical etchant for a time period sufficient to expose a first crystallographic surface through the alternating layers of the semiconductor body at a substantially definite slope to the given surface, contacting the exposed crystallographic surface with a second chemical etchant selective of quarternary layers composed of InGaAsP for a time period sufficient to expose InGaAsP portions of a preferred crystallographic plane substantially perpendicular to the given surface, and contacting the exposed crystallographic surface corresponding to the InP layers with HCl for a time period sufficient to expose the InP portions of the preferred crystallographic plane to complete an optically flat mirror facet of the semiconductor heterostructure body.

7. The method as defined in claim 6 wherein the first chemical etchant is a dilute solution of $Br:CH_3OH$.

8. The method as defined in claim 10 wherein the first chemical etchant is $HCl:HNO_3=(1:\alpha)$ for $\alpha$ in the range $1 \leq \alpha \leq 5$.

9. The method as defined in claim 7 or claim 8 wherein the second chemical etchant is AB etchant.

10. The method as defined in claim 7 or claim 8 wherein the second chemical etchant is $H_2SO_4:H_2O_2:H_2O=(10:1:1)$.

11. The method as defined in claim 7 or claim 8 wherein the second chemical etchant is a solution of $KOH:K_3Fe(CN)_6:H_2O$.

12. A method for etching a multilayer semiconductor heterostructure body having alternating layers of InGaAsP and InP on a substrate layer, the method comprising the steps of:

processing a predetermined area on a given surface of the semiconductor body with a first chemical etchant for a time period sufficient to expose a first crystallographic surface through the alternating layers of the semiconductor body at a substantially definite slope to the given surface, contacting the first crystallographic surface with HCl for a time period sufficient to expose a portion of a second crystallographic surface corresponding to an exposed portion of each InP layer substantially perpendicular to the given surface, contacting the first and second crystallographic surfaces with a second chemical etchant selective of layers composed of InGaAsP for a time period sufficient to expose a portion of a preferred crystallographic plane corresponding to an exposed portion of each InGaAsP layer substantially perpendicular to the given surface, and contacting the second crystallographic surface with HCl for a time period sufficient to expose portions of the preferred crystallographic plane corresponding to exposed portions of the InP layers, thereby completing the preferred crystallographic plane as an optically flat mirror facet of the semiconductor heterostructure body.

13. The method as defined in claim 12 wherein the processing step includes contacting the predetermined area of the semiconductor body with a dry chemical etchant to expose the first crystallographic surface.

14. The method as defined in claim 12 wherein the processing step includes contacting the predetermined area of the semiconductor body with a solution of $HCl:HNO_3=(1:\alpha)$ to expose the first crystallographic surface, and $\alpha$ is in the range $1 \leq \alpha \leq 5$.

15. The method as defined in claim 13 or claim 14 wherein the second chemical etchant is AB etchant.

16. The method as defined in claim 13 or claim 14 wherein the second chemical etchant is $H_2SO_4:H_2O_2:H_2O=(10:1:1)$.

17. The method as defined in claim 13 or claim 14 wherein the second chemical etchant is a solution of $KOH:K_3Fe(CN)_6:H_2O$.

* * * * *

UNITED STATES PATENT AND TRADEMARK OFFICE
CERTIFICATE OF CORRECTION

PATENT NO. : 4,354,898
DATED : October 19, 1982
INVENTOR(S) : Larry A. Coldren and Kazuhito Furuya It is certified that error appears in the above—identified patent and that said Letters Patent is hereby corrected as shown below:

In the claims, claim 8, column 9, line 20, "10" should read --6--.

Signed and Sealed this

Seventeenth Day of April 1984

[SEAL]

Attest:

GERALD J. MOSSINGHOFF

Attesting Officer     Commissioner of Patents and Trademarks